United States Patent [19]

Kashiwaya

[11] Patent Number: 5,378,496
[45] Date of Patent: Jan. 3, 1995

[54] METHOD OF MANUFACTURING MAGNETIC RECORDING MEDIUM

[75] Inventor: Makoto Kashiwaya, Kanagawa, Japan

[73] Assignee: Fuji Photo Film Co., Ltd., Kanagawa, Japan

[21] Appl. No.: 161,265

[22] Filed: Dec. 3, 1993

[30] Foreign Application Priority Data

Dec. 3, 1992 [JP] Japan ................... 4-324092

[51] Int. Cl.$^6$ .............................................. B05D 5/12
[52] U.S. Cl. ...................... 427/128; 427/132; 427/251; 427/255.5; 427/296; 427/322; 427/398.2
[58] Field of Search ............. 427/128, 132, 296, 251, 427/255.5, 322, 348.2

[56] References Cited

FOREIGN PATENT DOCUMENTS 227732   6/1990   Japan .
44659    1/1992   Japan .
4147419  5/1992   Japan .

Primary Examiner—Bernard Pianalto
Attorney, Agent, or Firm—Sughrue, Mion, Zinn, Macpeak & Seas

[57] ABSTRACT

When manufacturing a magnetic recording medium, depositing material in a crucible is heated to evaporate, and the vapor particles of the deposition material is continuously deposited on a continuous substrate material running along the peripheral surface of a cylindrical cooling can between a position where the vapor particles impinge upon the substrate material at a large angle and a position where the vapor particles impinge upon the substrate material at a small angle. The distance $r(\theta min)$ between the substrate material and the depositing material in the crucible when the vapor particles impinge upon the substrate material at a minimum incidence angle and the distance $r(\theta max)$ between the substrate material and the depositing material in the crucible when the vapor particles impinge upon the substrate material at a maximum incidence angle satisfy the formula $0.25 \leq \{r(\theta min)/r(\theta max)\}^2$.

2 Claims, 4 Drawing Sheets

F I G. 4A
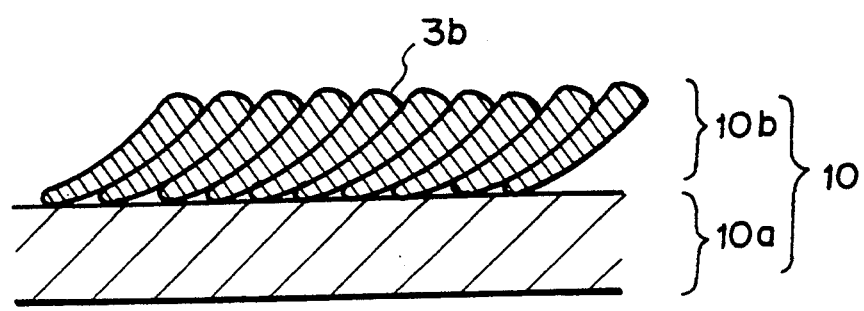
F I G. 4B
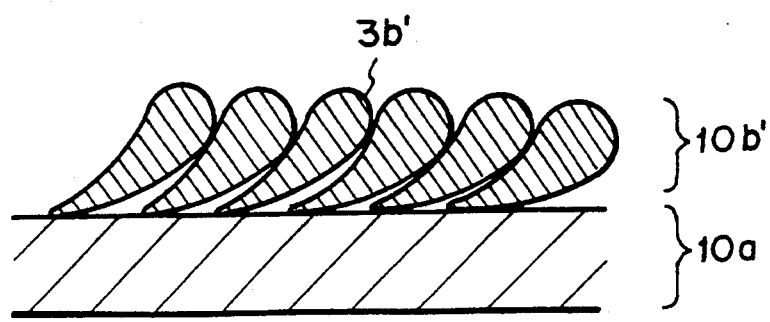

METHOD OF MANUFACTURING MAGNETIC RECORDING MEDIUM

BACKGROUND OF THE INVENTION

1. Field of the Invention

This invention relates to a method of manufacturing a magnetic recording tape such as a magnetic tape, and more particularly to an improvement in a method of manufacturing a magnetic recording medium by heating and evaporating depositing material and depositing the vapor particles of the depositing material on a substrate material running along the outer peripheral surface of a cylindrical cooling can.

2. Description of the Prior Art

There has been a demand for increase in the amount of information to be recorded on a magnetic recording medium such as a magnetic tape and for a high tone quality and a high image quality. As is well known, in order to meet such a demand, high-density recording is necessary. A deposition magnetic tape has been recently developed as a magnetic recording medium for high-density recording and has been put into practice as "Hi8ME Tape". The deposition tape comprises a substrate such as of PET (polyethylene terephthalate) or PEN (polyethylene naphthalate) and a ferromagnetic metal layer such as of iron, cobalt, nickel and/or the like deposited on the substrate. The deposition magnetic tape has a high effective magnetic flux density Bm, a high coercive force Hc and a large squareness ratio SQ and is excellent in the electromagnetic characteristics in the short wavelength range. Further, in the deposition magnetic tape, since the magnetic layer may be small in thickness, the recording demagnetization and the thickness loss upon playback can be effectively suppressed, and since the magnetic layer is free from intervening materials such as additives or binders unlike in the conventional magnetic tape where the magnetic layer is formed by application, the charging density of the magnetic material can be increased.

In the normal method of manufacturing the deposition magnetic tape, depositing material such as ferromagnetic metals, e.g., iron, cobalt, nickel or alloys of such metals, in a crucible is heated to evaporate by an electron beam or the like, and the vapor particles of the deposition material is continuously deposited on a high polymer film such as of PET or PEN running along the outer peripheral surface of a cylindrical cooling can between a position where the vapor particles impinge upon the film at a large angle and a position where the vapor particles impinge upon the film at a small angle.

To further improve the coercive force Hc of the deposition magnetic tape is important to increase the playback signal output.

Accordingly there have been proposed various methods for improving the coercive force Hc of the deposition magnetic tape.

For example, Japanese Patent Publication No. 2(1990)-27732 says that the coercive force Hc of the deposition tape can be improved by forming an oxide layer on a magnetic layer of cobalt-nickel alloy by blowing oxidizing gas such as $O_2$ gas on the depositing portion of the high polymer film from a position near the position where the vapor particles impinge upon the film at a small angle.

Further it has been known that the coercive force Hc can be improved by increasing the minimum incidence angle (the minimum value of the angle at which the vapor particles impinge upon the film).

However when oxidizing gas such as $O_2$ gas is blown on the depositing portion of the high polymer film, the thickness of the oxide layer increases as the amount of the oxidizing gas blown on the film increases though the coercive force Hc increases with increase in the amount of the oxidizing gas. The oxide layer intervenes between the magnetic layer and the magnetic head for recording and playback, which results in lowering of output.

Further when the minimum incidence angle of the vapor particles is increased, the depositing efficiency lowers and the adhesive force of the vapor particles to the high polymer film deteriorates with increase in the minimum incidence angle. For example, when the minimum incidence angle is increased from 45° to 60°, the depositing efficiency lowers by not less than 50%.

SUMMARY OF THE INVENTION

In view of the foregoing observations and description, the primary object of the present invention is to provide a method of manufacturing a magnetic recording medium which can improve the coercive force Hc without lowering the output and the depositing efficiency.

The present invention is an improvement of the method of manufacturing a magnetic recording medium in which depositing material in a crucible is heated to evaporate by an electron beam or the like, and the vapor particles of the deposition material is continuously deposited on a continuous substrate material running along the outer peripheral surface of a cylindrical cooling can between a position where the vapor particles impinge upon the substrate material at a large angle and a position where the vapor particles impinge upon the substrate material at a small angle. The method in accordance with the present invention is characterized in that the distance $r(\theta min)$ between the substrate material and the depositing material in the crucible when the vapor particles impinge upon the substrate material at a minimum incidence angle and the distance $r(\theta max)$ between the substrate material and the depositing material in the crucible when the vapor particles impinge upon the substrate material at a maximum incidence angle satisfy the following formula (1).

$$0.25 \leq \{r(\theta min)/r(\theta max)\}^2 \qquad (1)$$

The minimum incidence angle is typically about 40° to 50°, and the maximum incidence angle is typically about 90° and the distance $r(\theta max)$ is typically 300 to 700 mm.

The incidence angle is the angle between the normal of the substrate material and the impinging line of the vapor particles at a point at which the vapor particles are deposited on the substrate material.

The vapor particles at first impinge upon the substrate material at a large angle. That is, the vapor particles first deposited on the substrate material are deposited thereon at about 0° to the direction of movement of the substrate material. Though the vapor particles are continuously deposited on the substrate material running along the peripheral surface of the cooling can, microscopically vapor particles are successively deposited on the vapor particles first deposited on the substrate material to form columnar particles. The columnar particles grows on the substrate material in normal to the direction of movement of the substrate material as the substrate material runs along the cooling can.

The amount M of the vapor particles deposited on the substrate material when they impinges upon the substrate material at an incidence angle of $\theta$ is generally given by the following formula (2).

$$M = k \times (\cos^n \phi) \times (\cos \theta) \times T^4 / r^2 \qquad (2)$$

wherein k is a constant, n is a constant determined according to the kind of the heating means, $\phi$ is the angle at which the vapor particles diffuse from the depositing material, T is the temperature of the depositing material and r is the distance between the substrate material and the depositing material in the crucible.

As can be understood from the formula (2), the columnar particles are shaped like a teardrop shape whose thickness is small at the end on the substrate material and large at the free end since the amount $M(\theta\min)$ of the vapor particles deposited on the substrate material when they impinges upon the substrate material at the minimum incidence angle ($\theta\min$) is large and the amount $M(\theta\max)$ of the vapor particles deposited on the substrate material when they impinges upon the substrate material at the maximum incidence angle ($\theta\max$) is small.

When the distance $r(\theta\min)$ between the substrate material and the depositing material in the crucible when the vapor particles impinge upon the substrate material at a minimum incidence angle and the distance $r(\theta\max)$ between the substrate material and the depositing material in the crucible when the vapor particles impinge upon the substrate material at a maximum incidence angle satisfy the formula (1), the amount $M(\theta\min)$ of the vapor particles deposited on the substrate material when they impinges upon the substrate material at the minimum incidence angle ($\theta\min$) is reduced and the amount ($\theta\min$) of the vapor particles deposited on the substrate material when they impinges upon the substrate material at the maximum incidence angle ($\theta\max$) is increased, whereby the thickness of each columnar particle is uniformed. It has been experimentally known that the magnetic layer comprising columnar particles having such a uniformed thickness is superior in coercive force to that comprising columnar particles of teardrop shape.

Thus, in accordance with the method of the present invention, the coercive force can be improved without lowering the depositing efficiency. Further, since the magnetic recording medium manufactured by the method of the present invention is free from intervening materials such as oxide layer, high output can be ensured.

BRIEF DESCRIPTION OF THE DRAWINGS

FIG. 4A is a view for illustrating the state of the magnetic layer formed by the method of the present invention, and FIG. 4B is a view for illustrating the state of the magnetic layer formed by the conventional method.

DESCRIPTION OF THE PREFERRED EMBODIMENT

Figure 1:
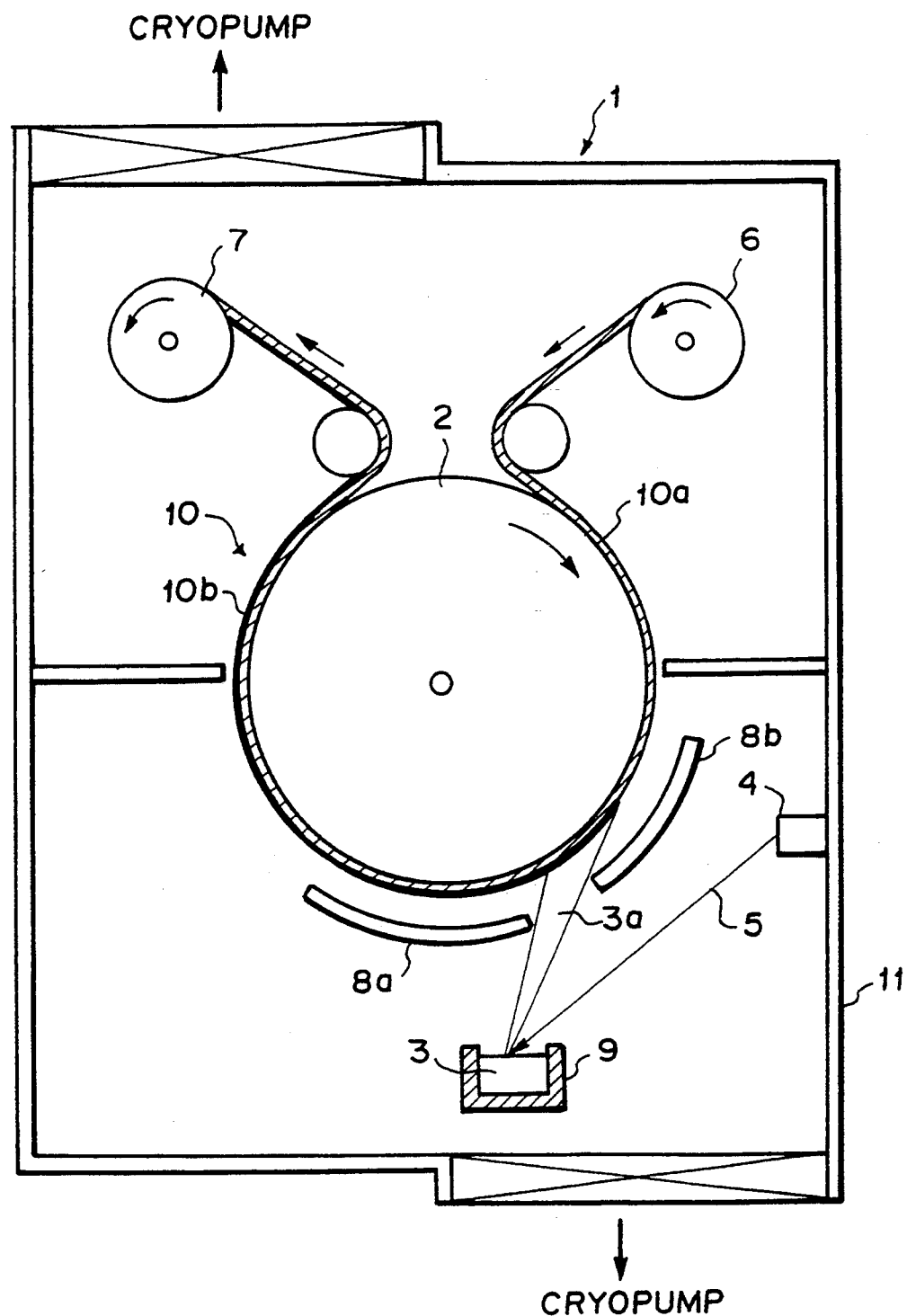
FIG. 1 is a schematic view showing an apparatus for carrying out the method of the present invention.
Figure 2:
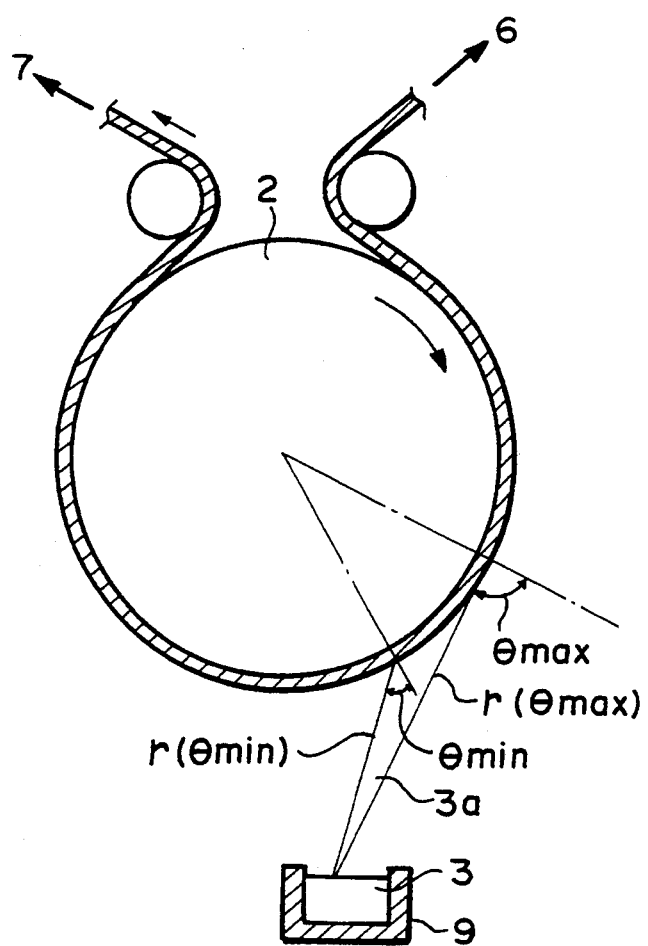
FIG. 2 is a view illustrating the position of the depositing material and the substrate material relative to each other.

In FIG. 1, a depositing apparatus 1 comprises a vacuum chamber 11 which is evacuated below $1.0 \times 10^{-4}$ Torr by a cryopump (not shown). A cooling can 2 which feeds a PET substrate film 10a in a continuous length wound around a roll 6 in the direction of arrows, a crucible 9 which is positioned below the cooling can 2 and holds therein a depositing material such as Co80-Ni20 alloy, and an electron gun 4 which emits an electron beam 5 for heating and evaporating the depositing material 3 are provided in the vacuum chamber 11. A minimum incidence angle mask 8a which controls a minimum of the angle at which vapor particles 3a of the depositing material 3 impinge upon the substrate film 10a (the minimum incidence angle ($\theta\min$)) to about 40° and a mask 8b which controls a maximum of the angle at which vapor particles 3a of the depositing material 3 impinge upon the substrate film 10a (the maximum incidence angle ($\theta\max$)) to about 90° are provided to cover the substrate film 10a on the cooling can 2. As shown in FIG. 2, the crucible 9 is positioned so that the distance $r(\theta\min)$ between the substrate film 10a and the depositing material 3 in the crucible 9 when the vapor particles 3a impinge upon the substrate film 10a at the minimum incidence angle ($\theta\min$) and the distance $r(\theta\max)$ Between the substrate film 10a and the depositing material 3 in the crucible 9 when the vapor particles 3a impinge upon the substrate film 10a at the maximum incidence angle ($\theta\max$) satisfy the following formula (1).

$$0.25 \leq \{r(\theta\min)/r(\theta\max)\}^2 \qquad (1)$$

FIG. 3 shows the way the vapor particles 3a are deposited on the substrate film 10a as the substrate film 10a runs along the cooling can 2 in the direction of arrows and FIG. 4 shows the state of the magnetic layer formed of columnar particles formed by deposition of the vapor particles 3a.

Figure 3A:
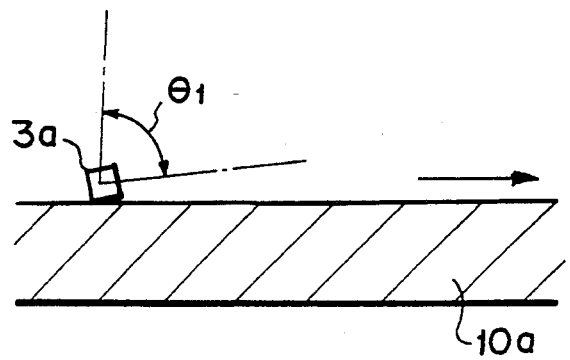
FIGS. 3A, 3B, 3C, 3D and 3E are views for illustrating how the vapor particles are deposited on the substrate material.
Figure 3B:
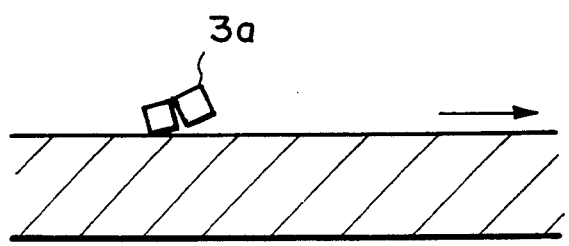
Figure 3C:
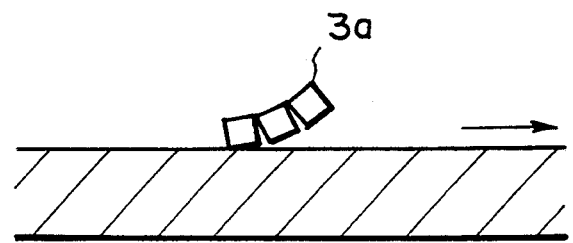
Figure 3D:
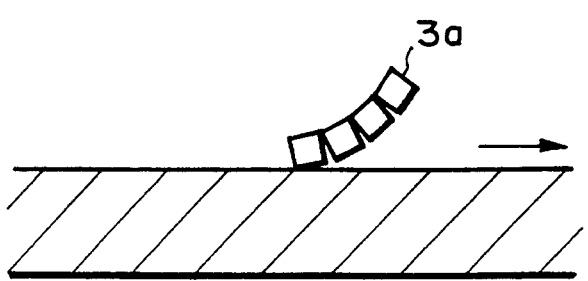
Figure 3E:
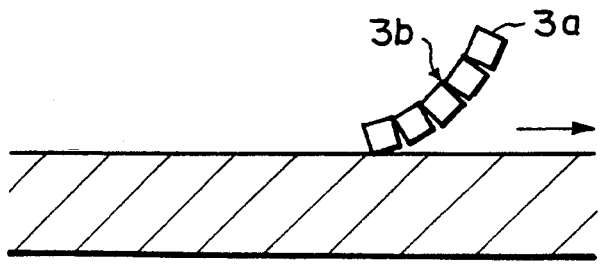

Microscopically the vapor particles 3a evaporating from the depositing material 3 heated by the electron beam 5 impinges upon the substrate film 10a at a large angle $\theta 1$ at first and are deposited thereon as shown in FIG. 3A. That is, the vapor particle deposited on the substrate film 10a at first adheres to the substrate film 10a at about 0° to the direction of movement of the substrate film 10a. The vapor particles 3a continuously adhere to the substrate film 10a running along the cooling can 2, and, as the substrate film 10a moves in the direction of the arrows, build up on the particle deposited on the substrate film 10a at first to form columnar particles 3b extending substantially in perpendicular to the direction of movement of the substrate film 10a. See FIGS. 3B to 3E. The shape of the columnar particle 3b is determined by the amount of the vapor particles 3a deposited on the substrate film 10a at each incidence angle $\theta$, which is determined by the distance r between the depositing material 3 in the crucible 9 and the substrate film 10a when the vapor particles 3a impinge upon the substrate film 10a at the incidence angle $\theta$. Accordingly, the shape of the columnar particle 3b formed by the depositing apparatus of this example where the distance $r(\theta\min)$ between the substrate film 10a and the depositing material 3 in the crucible 9 when the vapor particles 3a impinge upon the substrate film 10a at the minimum incidence angle ($\theta\min$) and the distance $r(\theta\max)$ between the substrate film 10a and the depositing material 3 in the crucible 9 when the vapor particles 3a impinge upon the substrate film 10a at the maximum incidence angle ($\theta$max) satisfy the formula (1) is as shown in FIG. 4A. As shown in FIG. 4A, the columnar particle 3b formed by the depositing apparatus of this example is substantially uniform in thickness, or the amount of deposited particles, as seen in the direction perpendicular to the surface of the substrate film 10a. As described above, the magnetic layer 10b formed of such columnar particles which are uniform in thickness has a coercive force higher than that of the magnetic layer 10b' formed of teardrop-shaped columnar particles shown in FIG. 4B.

The method of the present invention can be carried out in various ways without limiting to that described above. For example, the distance between the substrate film and the depositing material in the crucible may be adjusted by changing the position of the depositing material as well as by changing the diameter of the cooling can.

The vacuum chamber 11 was evacuated below $1.0 \times 10^{-4}$ Torr and a PET film, 500 mm in width and 6 $\mu$m in thickness, was transferred at a speed of 60 m/min along a cooling can which was 800 mm in diameter and kept at $-25°$ C. Co80Ni20 alloy was put in a crucible whose depositing area was 750 mm $\times$ 120 mm and was scanned by an electron beam of 90 to 100 kW. The crucible was positioned so that the maximum incidence angle ($\theta$max) was 90° and the minimum incidence angle ($\theta$min) was 45°. O$_2$ gas was introduced in an amount of 1.5 slm from the minimum incidence angle defining portion so that a Co.Ni-O layer of about 2000 Å was formed.

Then the position of the crucible (i.e., the position of the depositing material therein) was variously changed so that the value of $\{r(\theta min)/r(\theta max)\}^2$ changed variously with the maximum incidence angle ($\theta$max) and the minimum incidence angle ($\theta$min) kept respectively at 90° and 45°, thereby changing the shape of the columnar particles. The shape of the columnar particles were made sure by visually observing the cross section by Transmission Electron Microscopy.

The coercive forces Hc of the magnetic layers which were obtained for the various values of $\{r(\theta min)/r(\theta max)\}^2$ were as shown in the following table.

TABLE

| sample No. | $\{r(\theta min)/r(\theta max)\}^2$ | coercive force Hc (Oe) |
|---|---|---|
| 1 | 0.1500 | 810 |
| 2 | 0.1999 | 850 |
| 3 | 0.2635 | 920 |
| 4 | 0.2978 | 970 |
| 5 | 0.3248 | 1050 |
| 6 | 0.3623 | 1100 |
| 7 | 0.3861 | 1110 |
| 8 | 0.4000 | 1150 |

As can bee seen from the table above, the magnetic layers formed by the method of the present invention (samples No. 3 to No. 8, i.e., obtained for the values of $\{r(\theta min)/r(\theta max)\}^2$ within the range $0.25 \leq \{r(\theta min)/r(\theta max)\}^2$) have an improved coercive force as compared with the other samples (No. 1 and No. 2).

Further, it is preferred that $\{r(\theta min)/r(\theta max)\}^2$ be not smaller than 0.3 in order to increase the coercive force above 1000 Oe as can be understood from the table above.

What is claimed is:

1. A method of manufacturing a magnetic recording medium in which depositing material in a crucible is heated to evaporate, and the vapor particles of the deposition material is continuously deposited on a continuous substrate material running along the peripheral surface of a cylindrical cooling can between a position where the vapor particles impinge upon the substrate material at a large angle and a position where the vapor particles impinge upon the substrate material at a small angle, the method characterized in that
   the distance r($\theta$min) between the substrate material and the depositing material in the crucible when the vapor particles impinge upon the substrate material at a minimum incidence angle and the distance r($\theta$max) between the substrate material and the depositing material in the crucible when the vapor particles impinge upon the substrate material at a maximum incidence angle satisfy the formula $0.25 \leq \{r(\theta min)/r(\theta max)\}^2$.

2. A method as defined in claim 1 in which the distance r($\theta$min) between the substrate material and the depositing material in the crucible when the vapor particles impinge upon the substrate material at a minimum incidence angle and the distance r($\theta$max) between the substrate material and the depositing material in the crucible when the vapor particles impinge upon the substrate material at a maximum incidence angle satisfy the formula $0.3 \leq \{r(\theta min)/r(\theta max)\}^2$.

* * * * *